(12) United States Patent
Kim

(10) Patent No.: US 10,950,280 B2
(45) Date of Patent: Mar. 16, 2021

(54) SEMICONDUCTOR DEVICE

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/017,528

(22) Filed: Sep. 10, 2020

(65) Prior Publication Data
US 2020/0411070 A1 Dec. 31, 2020

Related U.S. Application Data

(62) Division of application No. 16/219,483, filed on Dec. 13, 2018, now Pat. No. 10,811,063.

(30) Foreign Application Priority Data

Sep. 20, 2018 (KR) .................. 10-2018-0113301

(51) Int. Cl.
| | | |
|---|---|---|
| G11C 7/00 | (2006.01) | |
| G11C 7/10 | (2006.01) | |
| G11C 8/04 | (2006.01) | |
| G11C 11/4093 | (2006.01) | |
| G11C 11/4096 | (2006.01) | |
| G11C 11/408 | (2006.01) | |
| G11C 7/22 | (2006.01) | |

(52) U.S. Cl.
CPC ............ *G11C 7/1045* (2013.01); *G11C 7/106* (2013.01); *G11C 7/1057* (2013.01); *G11C 7/1063* (2013.01); *G11C 7/1087* (2013.01); *G11C 7/222* (2013.01); *G11C 8/04* (2013.01); *G11C 11/4082* (2013.01); *G11C 11/4087* (2013.01); *G11C 11/4093* (2013.01); *G11C 11/4096* (2013.01)

(58) Field of Classification Search
CPC ..... G11C 7/1045; G11C 7/1057; G11C 7/106; G11C 7/1063; G11C 7/1087; G11C 7/222; G11C 8/04; G11C 11/4082; G11C 11/4087; G11C 11/4093
USPC ........................................ 365/189.011–225.7
See application file for complete search history.

(56) References Cited

U.S. PATENT DOCUMENTS

| | | | | |
|---|---|---|---|---|
| 8,031,534 B2* | 10/2011 | Lee | ....................... | G11C 7/1039 365/189.05 |
| 8,130,564 B2* | 3/2012 | Lee | ....................... | G11C 7/1039 365/189.05 |
| 2010/0027358 A1* | 2/2010 | Lee | ....................... | G11C 7/1039 365/194 |
| 2011/0310677 A1* | 12/2011 | Lee | ....................... | G11C 7/1039 365/189.05 |
| 2018/0025760 A1 | 1/2018 | Mazumder et al. | | |

FOREIGN PATENT DOCUMENTS

KR  101047000 B1  7/2011

* cited by examiner

*Primary Examiner* — Harry W Byrne
(74) *Attorney, Agent, or Firm* — William Park & Associates Ltd.

(57) ABSTRACT

A semiconductor device includes an information signal generation circuit configured to store the register information depending on an input control signal generated based on the mode register read command, and output the stored register information depending on an output control signal generated based on the mode register read command.

12 Claims, 16 Drawing Sheets

FIG.4

| MA<1> | MA<2> | RS<1> | RS<2> | RS<3> |
|---|---|---|---|---|
| H | L | H | L | L |
| L | H | L | H | L |
| H | H | L | L | H |

SEMICONDUCTOR DEVICE

CROSS-REFERENCE TO RELATED APPLICATION

The present application is a divisional application of U.S. patent application Ser. No. 16/219,483, filed on Dec. 13, 2018, and claims priority under 35 U.S.C. § 119(a) to Korean Patent Application No. 10-2018-0113301 filed on Sep. 20, 2018 in the Korean Intellectual Property Office, which is incorporated herein by reference in its entirety.

BACKGROUND

1. Technical Field

Embodiments of the present disclosure generally relate to a semiconductor device which performs a mode register read operation.

2. Related Art

A semiconductor device includes registers which store informations necessary to perform internal operations. Mode information necessary for internal operations may include various latency information such as a CAS (column address strobe) latency and data information such as a burst length. The semiconductor device may store the necessary mode information in registers by performing a mode register write operation when an initializing operation is performed, for example, a boot-up operation.

SUMMARY

In an embodiment, a semiconductor device may include: a register information generation circuit configured to generate register information based on a mode register read command; and an information signal generation circuit configured to store the register information depending on an input control signal generated based on the mode register read command, and output the stored register information depending on an output control signal generated based on the mode register read command.

In an embodiment, a semiconductor device may include: an input control signal generation circuit configured to sequentially generate a first input control signal and a second input control signal based on a mode register read signal; an output control signal generation circuit configured to sequentially generate a first output control signal and a second output control signal based on the mode register read signal; and an information signal generation circuit configured to store register information depending on the first input control signal when the mode register read signal is generated first, output the stored register information as an information signal depending on the first output control signal, store the register information depending on the second input control signal when the mode register read signal is generated second, and output the stored register information as the information signal depending on the second output control signal.

In an embodiment, a semiconductor device may include: an output control signal generation circuit configured to sequentially generate output control signals based on a mode register read signal including a mode register read command, and an information signal generation circuit configured to output stored register information depending on the output control signals.

BRIEF DESCRIPTION OF THE DRAWINGS

FIG. 4 is a representation of an example of a table to assist in the explanation of the operation of the register select signal generation circuit included in the register information generation circuit illustrated in FIG. 2.

DETAILED DESCRIPTION

Hereinafter, a semiconductor device will be described below with reference to the accompanying drawings through various examples of embodiments.

Various embodiments may be directed to a semiconductor device which performs a mode register read operation.

According to the embodiments, by storing register information in a pipe latch and outputting an information signal each time a mode register read command is inputted, it may be possible to stably and continuously perform a mode register read operation.

Also, according to the embodiments, by continuously performing a mode register read operation by using a pipe latch, it may be possible to reduce current consumption and minimize a layout area needed for performing a mode register read operation.

Figure 1:
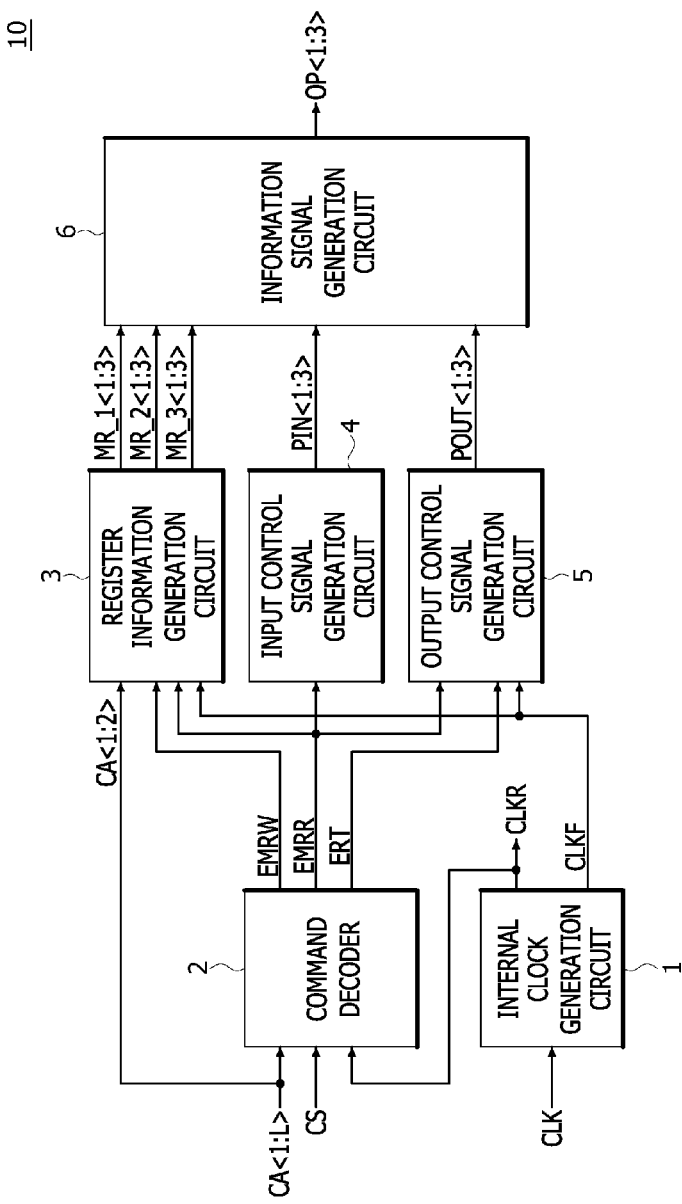
FIG. 1 is a block diagram illustrating a representation of an example of the configuration of a semiconductor device in accordance with an embodiment.

As illustrated in FIG. 1, a semiconductor device 10 in accordance with an embodiment may include an internal clock generation circuit 1, a command decoder 2, a register information generation circuit 3, an input control signal generation circuit 4, an output control signal generation circuit 5 and an information signal generation circuit 6.

The internal clock generation circuit 1 may receive a clock CLK (i.e., clock signal) and generate a first internal clock CLKR (i.e., first internal clock signal) and a second internal clock CLKF (i.e., second internal clock signal). The internal clock generation circuit 1 may generate the first internal clock CLKR which has the same phase as the clock CLK. The internal clock generation circuit 1 may generate the second internal clock CLKF which has a phase opposite to the clock CLK. While the cycle of each of the first internal clock CLKR and the second internal clock CLKF is set to be the same as the cycle of the clock CLK in an embodiment, the cycle may be set to be different from the cycle of the clock CLK depending on the embodiments.

The command decoder 2 may generate a mode register write signal EMRW, a mode register read signal EMRR and a read signal ERT based on a command address CA<1:L>, a chip select signal CS and the first internal clock CLKR. The command address CA<1:L> may include a command and an address which are applied from outside the semiconductor device 10. The bit number L of the command address CA<1:L> may be set variously depending on an embodiment.

The command decoder 2 may generate the mode register write signal EMRW in the case where the command address CA<1:L> having a first logic level combination is inputted in synchronization with the chip select signal CS and the first internal clock CLKR. The mode register write signal EMRW may be generated for a mode register write operation of storing information in mode registers. The first logic level combination of the command address CA<1:L> for generating the mode register write signal EMRW may be set variously depending on an embodiment.

The command decoder 2 may generate the mode register read signal EMRR in the case where the command address CA<1:L> having a second logic level combination is inputted in synchronization with the chip select signal CS and the first internal clock CLKR. The mode register read signal EMRR may be generated for a mode register read operation of outputting the information stored in mode registers. The second logic level combination of the command address CA<1:L> for generating the mode register read signal EMRR may be set variously depending on an embodiment.

The command decoder 2 may generate the read signal ERT in the case where the command address CA<1:L> having a third logic level combination is inputted in synchronization with the chip select signal CS and the first internal clock CLKR. The read signal ERT may be generated for a read operation of outputting the data stored in memory cells. The third logic level combination of the command address CA<1:L> for generating the read signal ERT may be set variously depending on an embodiment.

The register information generation circuit 3 may generate a first register information MR_1<1:3>, a second register information MR_2<1:3> and a third register information MR_3<1:3> from the command address CA<1:2> based on the mode register write signal EMRW, the mode register read signal EMRR and the second internal clock CLKF. The register information generation circuit 3 may selectively generate one information signal among the first register information MR_1<1:3>, the second register information MR_2<1:3> and the third register information MR_3<1:3> signals depending on the logic level combination of the command address CA<1:2> inputted in synchronization with the second internal clock CLKF in the case where the mode register write signal EMRW or the mode register read signal EMRR is generated. The configuration and operation of the register information generation circuit 3 will be described later with reference to FIGS. 2 to 5.

The input control signal generation circuit 4 may generate first to third input control signals PIN<1:3> based on the mode register read signal EMRR. The input control signal generation circuit 4 may sequentially generate the first to third input control signals PIN<1:3> in the case where the mode register read signal EMRR is generated. The input control signal generation circuit 4 may generate the first input control signal PIN<1> in the case where the mode register read signal EMRR is generated first. The input control signal generation circuit 4 may generate the second input control signal PIN<2> in the case where the mode register read signal EMRR is generated second. The input control signal generation circuit 4 may generate the third input control signal PIN<3> in the case where the mode register read signal EMRR is generated third. The configuration and operation of the input control signal generation circuit 4 will be described later with reference to FIG. 6.

The output control signal generation circuit 5 may generate first to third output control signals POUT<1:3> based on the mode register read signal EMRR, the read signal ERT and the second internal clock CLKF. The output control signal generation circuit 5 may generate the first to third output control signals POUT<1:3> at a time when a preset output delay period has elapsed in synchronization with the second internal clock CLKF, in the case where the mode register read signal EMRR or the read signal ERT is generated. The output control signal generation circuit 5 may generate the first output control signal POUT<1> at a time when the output delay period has elapsed from a time when the mode register read signal EMRR or the read signal ERT is generated first. The output control signal generation circuit 5 may generate the second output control signal POUT<2> at a time when the output delay period has elapsed from a time when the mode register read signal EMRR or the read signal ERT is generated second. The output control signal generation circuit 5 may generate the third output control signal POUT<3> at a time when the output delay period has elapsed from a time when the mode register read signal EMRR or the read signal ERT is generated third. The configuration and operation of the output control signal generation circuit 5 will be described later with reference to FIGS. 7 and 8.

The information signal generation circuit 6 may generate first to third information signals OP<1:3> from the first register information MR_1<1:3>, the second register information MR_2<1:3> and the third register information MR_3<1:3> based on the first to third input control signals PIN<1:3> and the first to third output control signals POUT<1:3>. The information signal generation circuit 6 may store one information generated among the first register information MR_1<1:3>, the second register information MR_2<1:3> and the third register information MR_3<1:3> based on the first to third input control signals PIN<1:3>. The information signal generation circuit 6 may output the information stored among the first register information MR_1<1:3>, the second register information MR_2<1:3> and the third register information MR_3<1:3> as the first to third information signals OP<1:3> based on the first to third output control signals POUT<1:3>. The configuration and operation of the information signal generation circuit 6 will be described later with reference to FIGS. 9 to 12.

Figure 2:
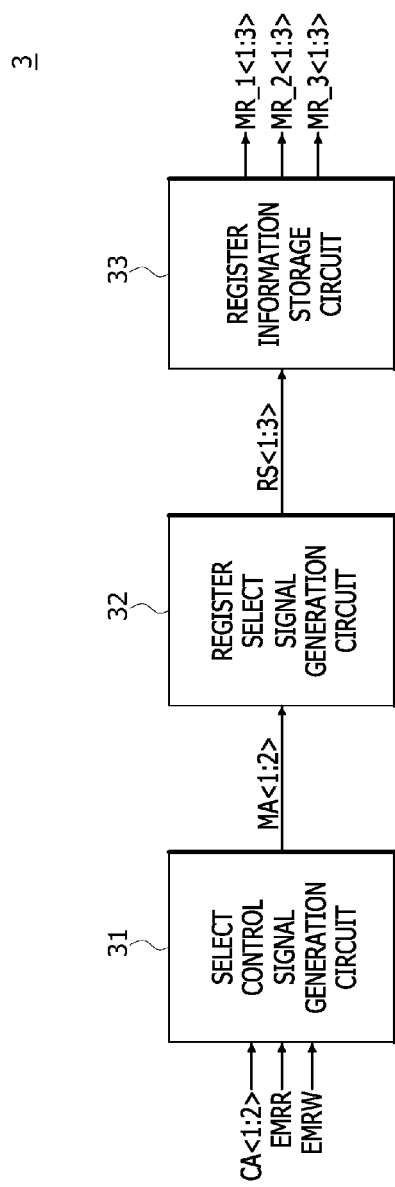
FIG. 2 is a block diagram illustrating a representation of an example of the configuration of the register information generation circuit included in the semiconductor device illustrated in FIG. 1.

As illustrated in FIG. 2, the register information generation circuit 3 may include a select control signal generation circuit 31, a register select signal generation circuit 32 and a register information storage circuit 33.

The select control signal generation circuit 31 may latch the command address CA<1:2> in synchronization with the second internal clock CLKF in the case where the mode register write signal EMRW or the mode register read signal EMRR is generated, and may generate a select control signal MA<1:2> from the latched command address CA<1:2>. The configuration and operation of the select control signal generation circuit 31 will be described later with reference to FIG. 3.

The register select signal generation circuit 32 may generate a register select signal RS<1:3> from the select control signal MA<1:2>. The register select signal generation circuit 32 may generate the register select signal RS<1:3> by decoding the select control signal MA<1:2>. The register select signal generation circuit 32 may generate one among the bits included in the register select signal RS<1:3> depending on the logic level combination of the select control signal MA<1:2>. The operation of the register select signal generation circuit 32 will be described later with reference to FIG. 4.

The register information storage circuit 33 may generate the first register information MR_1<1:3>, the second register information MR_2<1:3> and the third register information MR_3<1:3> from the register select signal RS<1:3>. The register information storage circuit 33 may selectively generate one information among the first register information MR_1<1:3>, the second register information MR_2<1:3> and the third register information MR_3<1:3> depending on the logic level combination of the register select signal RS<1:3>. The register information storage circuit 33 may generate the first register information MR_1<1:3> among the first register information MR_1<1:3>, the second register information MR_2<1:3> and the third register information MR_3<1:3> in the case where the register select signal RS<1:3> has a first logic level combination. The register information storage circuit 33 may generate the second register information MR_2<1:3> among the first register information MR_1<1:3>, the second register information MR_2<1:3> and the third register information MR_3<1:3> in the case where the register select signal RS<1:3> has a second logic level combination. The register information storage circuit 33 may generate the third register information MR_3<1:3> among the first register information MR_1<1:3>, the second register information MR_2<1:3> and the third register information MR_3<1:3> in the case where the register select signal RS<1:3> has a third logic level combination. The first to third logic level combinations of the register select signal RS<1:3> may be set variously depending on an embodiment. The configuration and operation of the register information storage circuit 33 will be described later with reference to FIG. 5.

Figure 3:
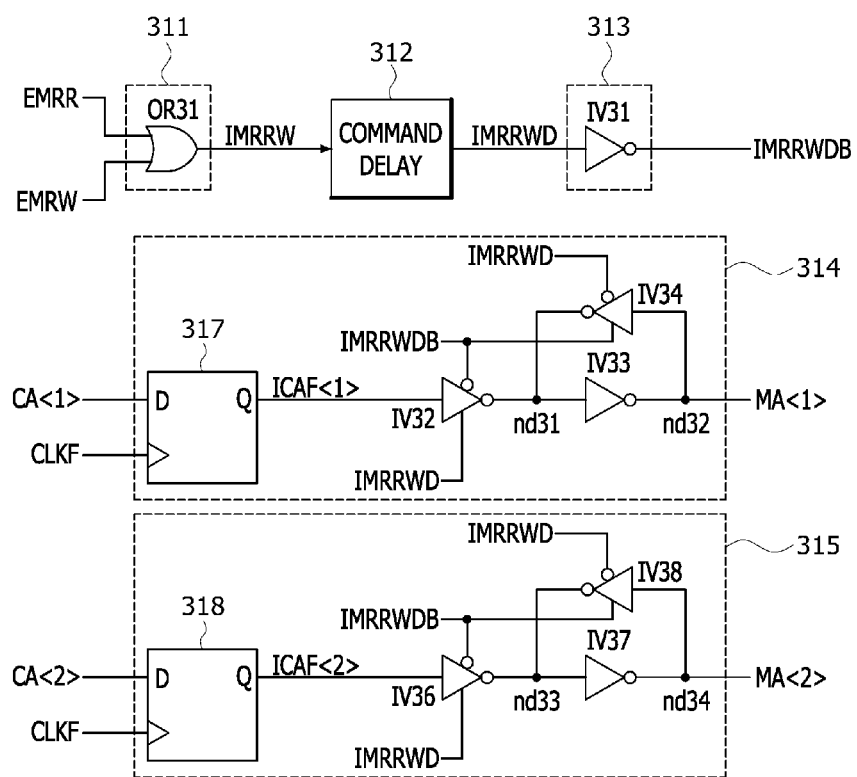
FIG. 3 is a circuit diagram illustrating a representation of an example of the select control signal generation circuit included in the register information generation circuit illustrated in FIG. 2.

As illustrated in FIG. 3, the select control signal generation circuit 31 may include an internal summed command circuit 311, a command delay 312, an inverted command generator 313, a first register information outputter 314 and a second register information outputter 315.

The internal summed command circuit 311 may sum the mode register write signal EMRW and the mode register read signal EMRR and generate an internal summed command IMRRW. The internal summed command circuit 311 may perform an OR operation and may include, for example, an OR gate OR31. The OR gate OR31 may receive the mode register write signal EMRW and the mode register read signal EMRR, and may perform an OR logic operation. The internal summed command circuit 311 may generate the internal summed command IMRRW in the case where the mode register write signal EMRW or the mode register read signal EMRR is generated.

The command delay 312 may delay the internal summed command IMRRW and generate a delayed summed command IMRRWD. A delay period by which the command delay 312 delays the internal summed command IMRRW may be set variously depending on an embodiment.

The inverted command generator 313 may include an inverter IV31. The inverter IV31 may invert and buffer the delayed summed command IMRRWD. The inverted command generator 313 may invert and buffer the delayed summed command IMRRWD and generate an inverted summed command IMRRWDB.

The first register information outputter 314 may include a first command address latch 317 and may perform inversion operations and may include, for example, inverters IV32, IV33 and IV34. The first command address latch 317 may latch the command address CA<1> in synchronization with the second internal clock CLKF and output the latched command address CA<1> as an internal command address ICAF<1>. The first command address latch 317 may be realized by a D flip-flop. The inverter IV32 may invert and buffer the internal command address ICAF<1> in the case where the delayed summed command IMRRWD is generated at logic high level, and may output a signal to a node nd31. The inverter IV33 may invert and buffer the signal of the node nd31, and may output the select control signal MA<1> through a node nd32. The inverter IV34 may invert and buffer the signal of the node nd32 in the case where the inverted summed command IMRRWDB is generated at a logic high level, and may output a signal to the node nd31. The inverters IV33 and IV34 may latch the signals of the nodes nd31 and nd32. The first register information outputter 314 may latch the command address CA<1> in synchronization with the second internal clock CLKF in the case where the mode register write signal EMRW or the mode register read signal EMRR is generated, and may generate the select control signal MA<1> from the latched command address CA<1>.

The second register information outputter 315 may include a second command address latch 318 and may perform inversion operations, and may include, for example inverters IV36, IV37 and IV38. The second command address latch 318 may latch the command address CA<2> in synchronization with the second internal clock CLKF and output the latched command address CA<2> as an internal command address ICAF<2>. The second command address latch 318 may be realized by a D flip-flop. The inverter IV36 may invert and buffer the internal command address ICAF<2> in the case where the delayed summed command IMRRWD is generated at the logic high level, and may output a signal to a node nd33. The inverter IV37 may invert and buffer the signal of the node nd33, and may output the select control signal MA<2> through a node nd34. The inverter IV38 may invert and buffer the signal of the node nd34 in the case where the inverted summed command IMRRWDB is generated at the logic high level, and may output a signal to the node nd33. The inverters IV37 and IV38 may latch the signals of the nodes nd33 and nd34. The second register information outputter 315 may latch the command address CA<2> in synchronization with the second internal clock CLKF in the case where the mode register write signal EMRW or the mode register read signal EMRR is generated, and may generate the select control signal MA<2> from the latched command address CA<2>.

Figure 4:
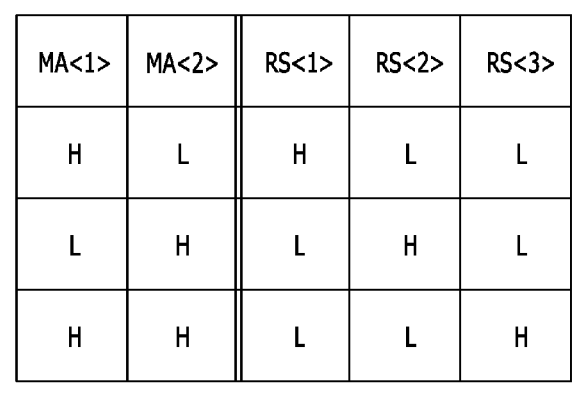

Referring to FIG. 4, the logic level combinations of the register select signal RS<1:3> which is generated depending on the logic level combination of the select control signal MA<1:2> may be seen. In the case where the logic level combination of the select control signal MA<1:2> is 'H, L,' the logic level combination of the register select signal RS<1:3> may be generated as 'H, L, L.' The case where the logic level combination of the select control signal MA<1:2> is 'H, L' means that the select control signal MA<1> is a logic high level and the select control signal MA<2> is a logic low level. The case where the logic level combination of the register select signal RS<1:3> is 'H, L, L' means that register select signal RS<1> is generated at a logic high level. In the case where the logic level combination of the select control signal MA<1:2> is 'H, L,' the register select signal RS<1> may be generated at the logic high level. In the case where the logic level combination of the select control signal MA<1:2> is 'L, H,' the register select signal RS<2> may be generated at a logic high level. In the case where the logic level combination of the select control signal MA<1:2> is 'H, H,' the register select signal RS<3> may be generated at a logic high level.

Figure 5:
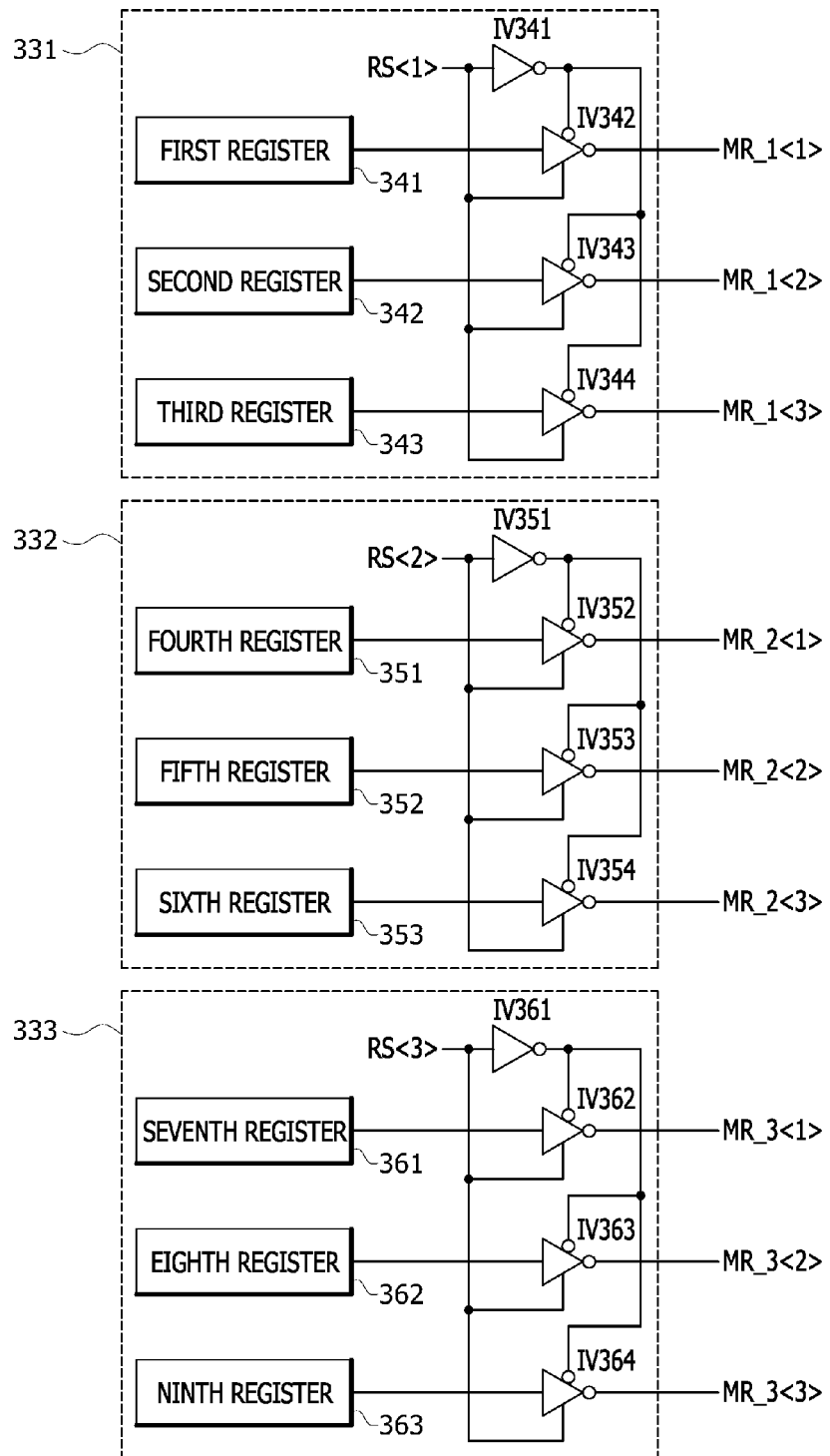
FIG. 5 is a circuit diagram illustrating a representation of an example of the register information storage circuit included in the register information generation circuit illustrated in FIG. 2.

As illustrated in FIG. 5, the register information storage circuit 33 may include a first register information storage circuit 331, a second register information storage circuit 332 and a third register information storage circuit 333.

The first register information storage circuit 331 may include a first register 341, a second register 342, a third register 343 and may perform inversion operations, and may include, for example, inverters IV341, IV342, IV343 and IV344. The inverter IV341 may invert and buffer the register select signal RS<1> and output a signal. The inverter IV342 may output the information stored in the first register 341 as the first register information MR_1<1> in the case where the register select signal RS<1> is generated at the logic high level. The inverter IV343 may output the information stored in the second register 342 as the first register information MR_1<2> in the case where the register select signal RS<1> is generated at the logic high level. The inverter IV344 may output the information stored in the third register 343 as the first register information MR_1<3> in the case where the register select signal RS<1> is generated at the logic high level. Each of the first register 341, the second register 342 and the third register 343 may be realized by a mode register.

The second register information storage circuit 332 may include a fourth register 351, a fifth register 352, a sixth register 353 and may perform inversion operations, and may include, for example, inverters IV351, IV352, IV353 and IV354. The inverter IV351 may invert and buffer the register select signal RS<2> and output a signal. The inverter IV352 may output the information stored in the fourth register 351 as the second register information MR_2<1> in the case where the register select signal RS<2> is generated at the logic high level. The inverter IV353 may output the information stored in the fifth register 352 as the second register information MR_2<2> in the case where the register select signal RS<2> is generated at the logic high level. The inverter IV354 may output the information stored in the sixth register 353 as the second register information MR_2<3> in the case where the register select signal RS<2> is generated at the logic high level. Each of the fourth register 351, the fifth register 352 and the sixth register 353 may be realized by a mode register.

The third register information storage circuit 333 may include a seventh register 361, an eighth register 362, a ninth register 363 and may perform inversion operations, and may include, for example, inverters IV361, IV362, IV363 and IV364. The inverter IV361 may invert and buffer the register select signal RS<3> and output a signal. The inverter IV362 may output the information stored in the seventh register 361 as the third register information MR_3<1> in the case where the register select signal RS<3> is generated at the logic high level. The inverter IV363 may output the information stored in the eighth register 362 as the third register information MR_3<2> in the case where the register select signal RS<3> is generated at the logic high level. The inverter IV364 may output the information stored in the ninth register 363 as the third register information MR_3<3> in the case where the register select signal RS<3> is generated at the logic high level. Each of the seventh register 361, the eighth register 362 and the ninth register 363 may be realized by a mode register.

Figure 6:
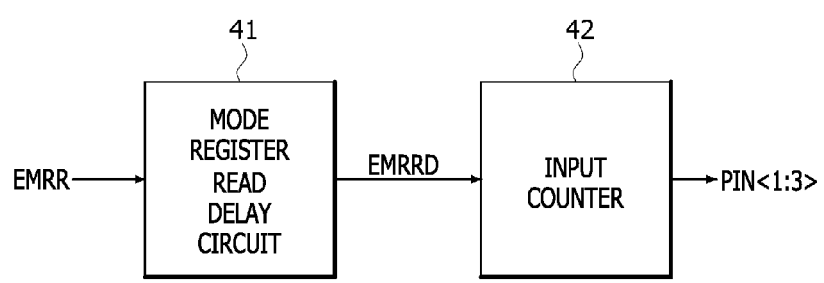
FIG. 6 is a block diagram illustrating a representation of an example of the configuration of the input control signal generation circuit included in the semiconductor device illustrated in FIG. 1.

As illustrated in FIG. 6, the input control signal generation circuit 4 may include a mode register read delay circuit 41 and an input counter 42.

The mode register read delay circuit 41 may delay the mode register read signal EMRR and generate a delayed mode register read signal EMRRD. A delay period by which the mode register read delay circuit 41 delays the mode register read signal EMRR may be set variously depending on an embodiment.

The input counter 42 may sequentially generate the first to third input control signals PIN<1:3> in the case where the delayed mode register read signal EMRRD is generated. The input counter 42 may generate the first input control signal PIN<1> in the case where the delayed mode register read signal EMRRD is generated first. The input counter 42 may generate the second input control signal PIN<2> in the case where the delayed mode register read signal EMRRD is generated second. The input counter 42 may generate the third input control signal PIN<3> in the case where the delayed mode register read signal EMRRD is generated third.

Figure 7:
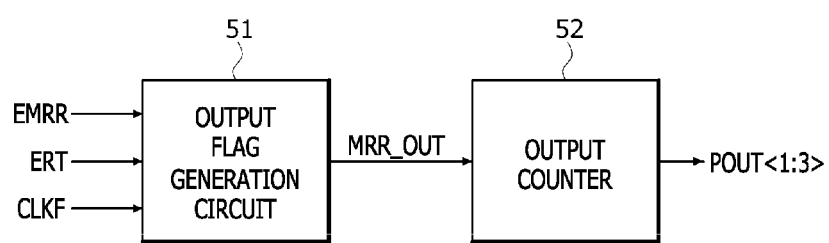
FIG. 7 is a block diagram illustrating a representation of an example of the configuration of the output control signal generation circuit included in the semiconductor device illustrated in FIG. 1.

As illustrated in FIG. 7, the output control signal generation circuit 5 may include an output flag generation circuit 51 and an output counter 52.

The output flag generation circuit 51 may generate an output flag MRR_OUT at a time when the preset output delay period has elapsed in synchronization with the second internal clock CLKF, in the case where the mode register read signal EMRR or the read signal ERT is generated. The configuration and operation of the output flag generation circuit 51 will be described below with reference to FIG. 8.

The output counter 52 may generate the first output control signal POUT<1> at a time when the output delay period has elapsed from a time when the output flag MRR_OUT is generated first. The output counter 52 may generate the second output control signal POUT<2> at a time when the output delay period has elapsed from a time when the output flag MRR_OUT is generated second. The output counter 52 may generate the third output control signal POUT<3> at a time when the output delay period has elapsed from a time when the output flag MRR_OUT is generated third.

Figure 8:
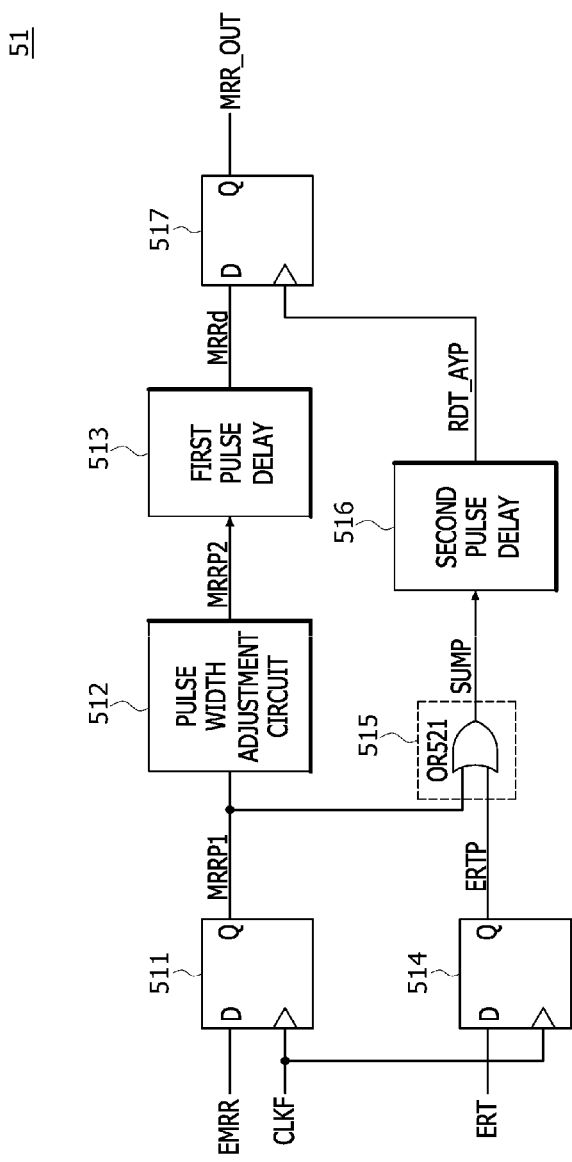
FIG. 8 is a block diagram illustrating a representation of an example of the configuration of the output flag generation circuit included in the output control signal generation circuit illustrated in FIG. 7.

As illustrated in FIG. 8, the output flag generation circuit 51 may include a first flag latch 511, a pulse width adjustment circuit 512, a first pulse delay 513, a second flag latch 514, a summed pulse generation circuit 515, a second pulse delay 516 and a flag output circuit 517.

The first flag latch 511 may latch the mode register read signal EMRR in synchronization with the second internal clock CLKF and output the latched mode register read signal EMRR as a first mode register read pulse MRRP1. The first flag latch 511 may output the mode register read signal EMRR which is generated in synchronization with the second internal clock CLKF, as the first mode register read pulse MRRP1. The first flag latch 511 may be realized by a D flip-flop.

The pulse width adjustment circuit 512 may adjust the pulse width of the first mode register read pulse MRRP1 and generate a second mode register read pulse MRRP2. In an embodiment, the pulse width of the second mode register read pulse MRRP2 may be set to be larger than the pulse width of the first mode register read pulse MRRP1. The pulse width adjustment circuit 512 may generate the second mode register read pulse MRRP2 as a level signal in the case where the mode register read signal EMRR is successively generated in synchronization with the second internal clock CLKF.

The first pulse delay 513 may delay the second mode register read pulse MRRP2 and generate a delayed mode register signal MRRd. A delay period by which the first pulse delay 513 delays the second mode register read pulse MRRP2 may be set variously depending on an embodiment.

The second flag latch 514 may latch the read signal ERT in synchronization with the second internal clock CLKF and output the latched read signal ERT as a read pulse ERTP. The second flag latch 514 may output the read signal ERT which is generated in synchronization with the second internal clock CLKF, as the read pulse ERTP. The second flag latch 514 may be realized by a D flip-flop.

The summed pulse generation circuit 515 may sum the first mode register read pulse MRRP1 and the read pulse ERTP and generate a summed pulse SUMP. The summed pulse generation circuit 515 may perform an OR operation and may include, for example, an OR gate OR521. The OR gate OR521 may perform an OR logic operation by receiving the first mode register read pulse MRRP1 and the read pulse ERTP, and may generate the summed pulse SUMP. The summed pulse generation circuit 515 may generate the summed pulse SUMP in the case where the first mode register read pulse MRRP1 or the read pulse ERTP is generated.

The second pulse delay 516 may delay the summed pulse SUMP and generate a read column pulse RDT_AYP. A delay period by which the second pulse delay 516 delays the summed pulse SUMP may be set variously depending on an embodiment.

The flag output circuit 517 may latch the delayed mode register signal MRRd in synchronization with the read column pulse RDT_AYP, and may output the latched delayed mode register signal MRRd as the output flag MRR_OUT. The flag output circuit 517 may be realized by a D flip-flop.

The output flag generation circuit 51 may generate the output flag MRR_OUT at a time when the preset output delay period has elapsed in synchronization with the second internal clock CLKF, in the case where the mode register read signal EMRR or the read signal ERT is generated. The output delay period may be set variously depending on an embodiment.

Figure 9:
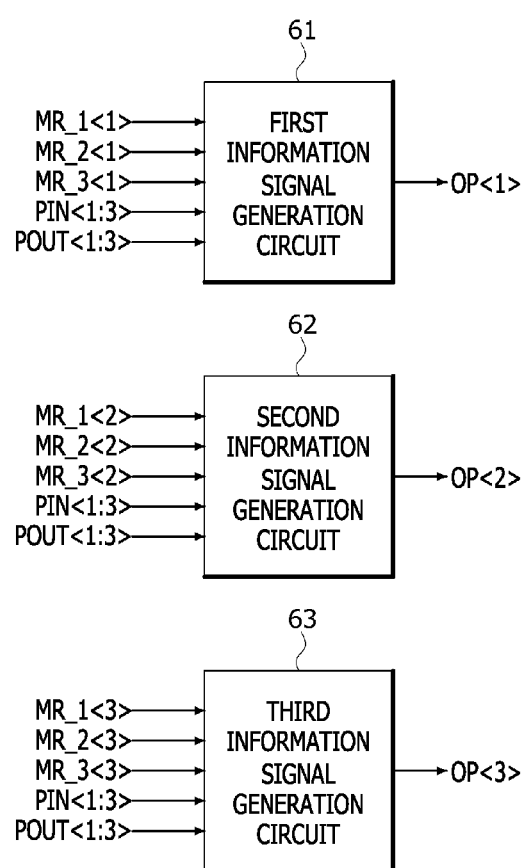
FIG. 9 is a block diagram illustrating a representation of an example of the configuration of the information signal generation circuit included in the semiconductor device illustrated in FIG. 1.

As illustrated in FIG. 9, the information signal generation circuit 6 may include a first information signal generation circuit 61, a second information signal generation circuit 62 and a third information signal generation circuit 63.

The first information signal generation circuit 61 may store one information generated among the first register information MR_1<1>, the second register information MR_2<1> and the third register information MR_3<1> based on the first to third input control signals PIN<1:3>. The first information signal generation circuit 61 may output the information stored among the first register information MR_1<1>, the second register information MR_2<1> and the third register information MR_3<1>, as the first information signal OP<1>, based on the first to third output control signals POUT<1:3>. The configuration and operation of the first information signal generation circuit 61 will be described later with reference to FIG. 10.

The second information signal generation circuit 62 may store one information generated among the first register information MR_1<2>, the second register information MR_2<2> and the third register information MR_3<2> based on the first to third input control signals PIN<1:3>. The second information signal generation circuit 62 may output the information stored among the first register information MR_1<2>, the second register information MR_2<2> and the third register information MR_3<2>, as the second information signal OP<2>, based on the first to third output control signals POUT<1:3>. The configuration and operation of the second information signal generation circuit 62 will be described later with reference to FIG. 11.

The third information signal generation circuit 63 may store one information generated among the first register information MR_1<3>, the second register information MR_2<3> and the third register information MR_3<3> based on the first to third input control signals PIN<1:3>. The third information signal generation circuit 63 may output the information stored among the first register information MR_1<3>, the second register information MR_2<3> and the third register information MR_3<3>, as the third information signal OP<3>, based on the first to third output control signals POUT<1:3>. The configuration and operation of the third information signal generation circuit 63 will be described later with reference to FIG. 12.

Figure 10:
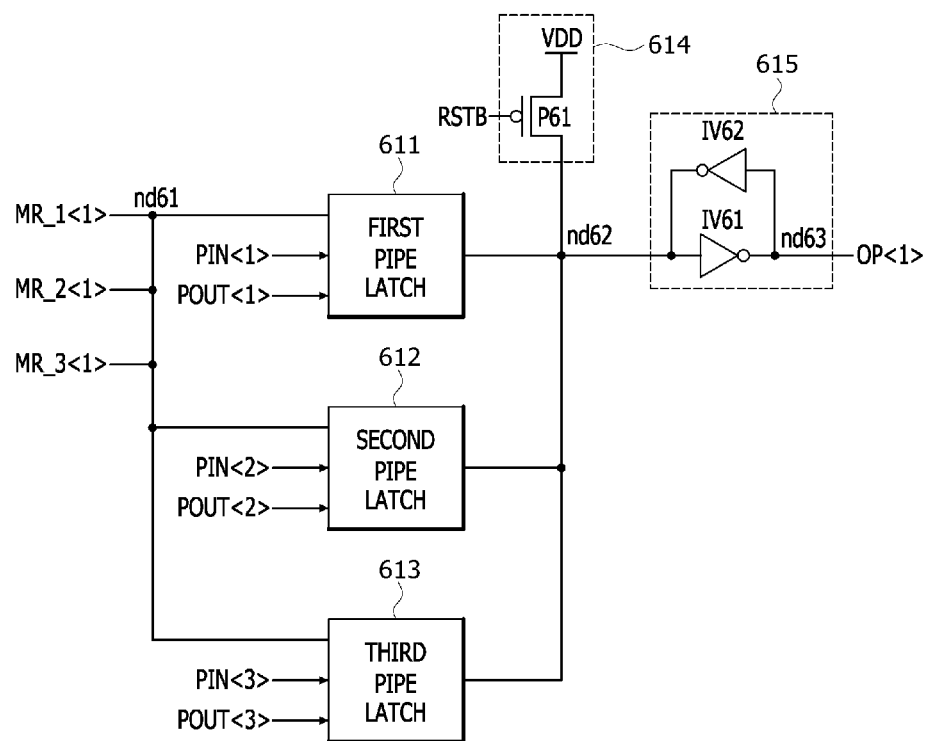
FIG. 10 is a circuit diagram illustrating a representation of an example of the first information signal generation circuit included in the information signal generation circuit illustrated in FIG. 9.

As illustrated in FIG. 10, the first information signal generation circuit 61 may include a first pipe latch 611, a second pipe latch 612, a third pipe latch 613, a first initializing element 614 and a first output buffer 615.

The first pipe latch 611 may receive, through a node nd61, one information generated among the first register information MR_1<1>, the second register information MR_2<1> and the third register information MR_3<1> based on the first input control signal PIN<1>, and store the received information. The first pipe latch 611 may output, to a node nd62, the information stored among the first register information MR_1<1>, the second register information MR_2<1> and the third register information MR_3<1> based on the first output control signal POUT<1>.

The second pipe latch 612 may receive, through the node nd61, one information generated among the first register information MR_1<1>, the second register information MR_2<1> and the third register information MR_3<1> based on the second input control signal PIN<2>, and store the received information. The second pipe latch 612 may output, to the node nd62, the information stored among the first register information MR_1<1>, the second register information MR_2<1> and the third register information MR_3<1> based on the second output control signal POUT<2>.

The third pipe latch 613 may receive, through the node nd61, one information generated among the first register information MR_1<1>, the second register information MR_2<1> and the third register information MR_3<1> based on the third input control signal PIN<3>, and store the received information. The third pipe latch 613 may output, to the node nd62, the information stored among the first register information MR_1<1>, the second register information MR_2<1> and the third register information MR_3<1> based on the third output control signal POUT<3>.

The first initializing element 614 may include a PMOS transistor P61. The PMOS transistor P61 may be turned on in response to a reset signal RSTB and drive the node nd62 to a power supply voltage VDD. The reset signal RSTB may be generated at a logic low level for an initializing operation. The first initializing element 614 may initialize the node nd62 to a logic high level in the case where the reset signal RSTB is generated at the logic low level.

The first output buffer 615 may include inverters IV61 and IV62. The inverter IV61 may invert and buffer the signal of the node nd62, and may output the first information signal OP<1> through a node nd63. The inverter IV62 may invert and buffer the signal of the node nd63, and may output a signal to the node nd62. The first output buffer 615 may output the first information signal OP<1> by inverting and buffering the signal of the node nd62, and may latch the signals of the node nd62 and the node nd63.

Figure 11:
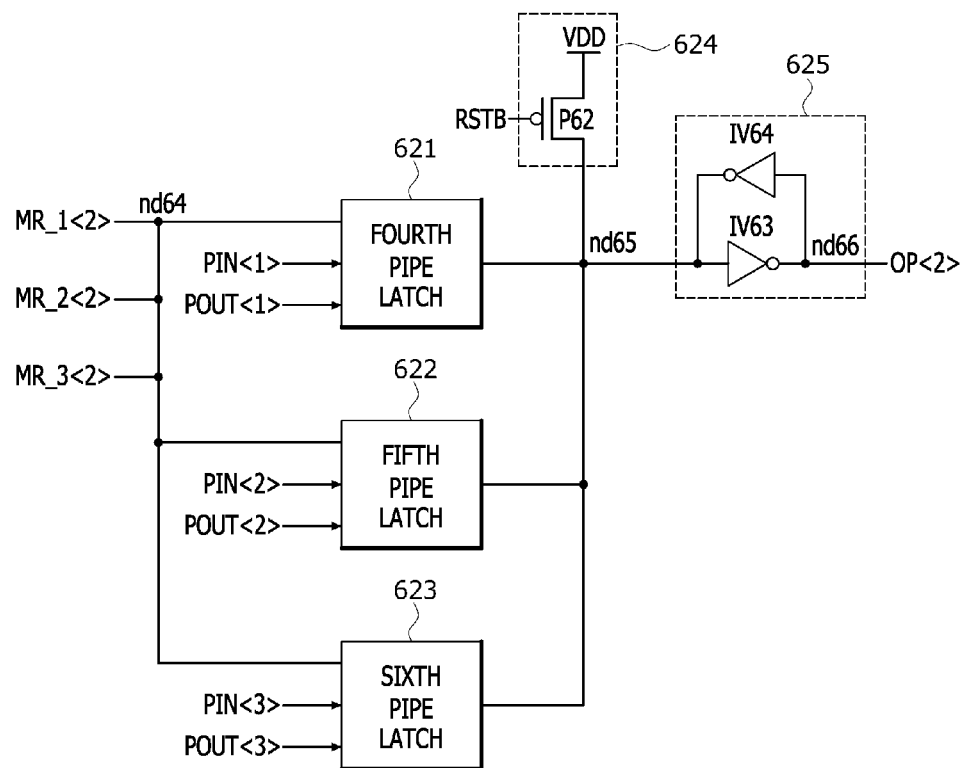
FIG. 11 is a circuit diagram illustrating a representation of an example of the second information signal generation circuit included in the information signal generation circuit illustrated in FIG. 9.

As illustrated in FIG. 11, the second information signal generation circuit 62 may include a fourth pipe latch 621, a fifth pipe latch 622, a sixth pipe latch 623, a second initializing element 624 and a second output buffer 625.

The fourth pipe latch 621 may receive, through a node nd64, one information generated among the first register information MR_1<2>, the second register information MR_2<2> and the third register information MR_3<2> based on the first input control signal PIN<1>, and store the received information. The fourth pipe latch 621 may output, to a node nd65, the information stored among the first register information MR_1<2>, the second register information MR_2<2> and the third register information MR_3<2> based on the first output control signal POUT<1>.

The fifth pipe latch 622 may receive, through the node nd64, one of the register information generated among the first register information MR_1<2>, the second register information MR_2<2> and the third register information MR_3<2> based on the second input control signal PIN<2>, and store the received information. The fifth pipe latch 622 may output, to the node nd65, the information stored among the first register information MR_1<2>, the second register information MR_2<2> and the third register information MR_3<2> based on the second output control signal POUT<2>.

The sixth pipe latch 623 may receive, through the node nd64, one of the register information generated among the first register information MR_1<2>, the second register information MR_2<2> and the third register information MR_3<2> based on the third input control signal PIN<3>, and store the received information. The sixth pipe latch 623 may output, to the node nd65, the information stored among the first register information MR_1<2>, the second register information MR_2<2> and the third register information MR_3<2> based on the third output control signal POUT<3>.

The second initializing element 624 may include a PMOS transistor P62. The PMOS transistor P62 may be turned on in response to the reset signal RSTB and drive the node nd65 to the power supply voltage VDD. The reset signal RSTB may be generated at the logic low level for an initializing operation. The second initializing element 624 may initialize the node nd65 to a logic high level in the case where the reset signal RSTB is generated at the logic low level.

The second output buffer 625 may perform inversion operations, and may include, for example, inverters IV63 and IV64. The inverter IV63 may invert and buffer the signal of the node nd65, and may output the second information signal OP<2> through a node nd66. The inverter IV64 may invert and buffer the signal of the node nd66, and may output a signal to the node nd65. The second output buffer 625 may output the second information signal OP<2> by inverting and buffering the signal of the node nd65, and may latch the signals of the node nd65 and the node nd66.

Figure 12:
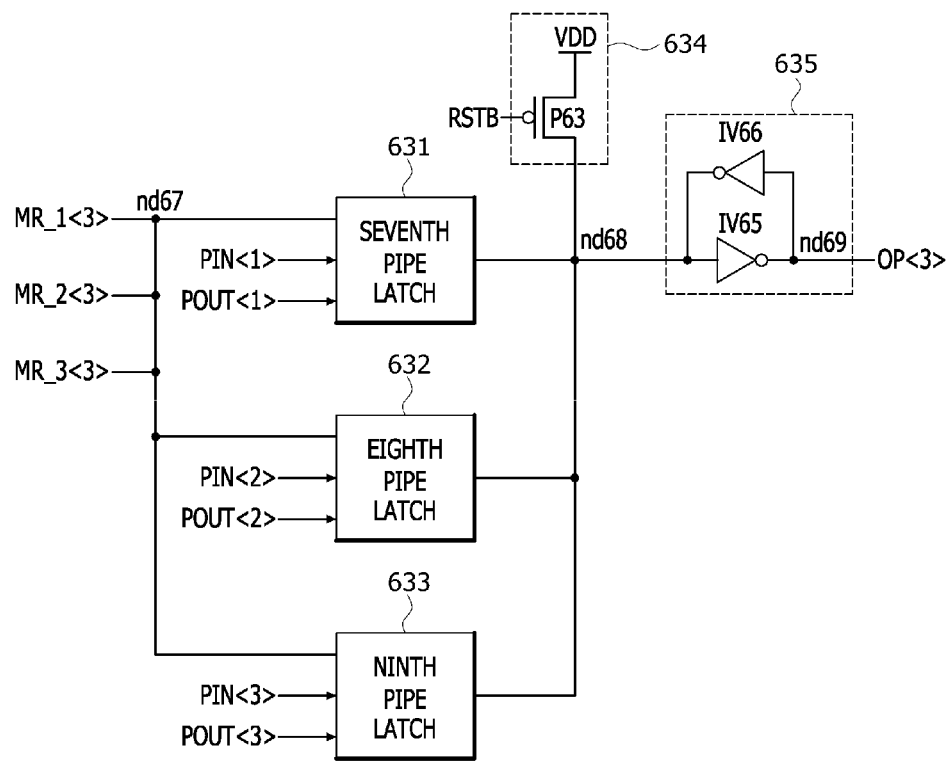
FIG. 12 is a circuit diagram illustrating a representation of an example of the third information signal generation circuit included in the information signal generation circuit illustrated in FIG. 9.

As illustrated in FIG. 12, the third information signal generation circuit 63 may include a seventh pipe latch 631, an eighth pipe latch 632, a ninth pipe latch 633, a third initializing element 634 and a third output buffer 635.

The seventh pipe latch 631 may receive, through a node nd67, one register information generated among the first register information MR_1<3>, the second register information MR_2<3> and the third register information MR_3<3> based on the first input control signal PIN<1>, and store the received information. The seventh pipe latch 631 may output, to a node nd68, the information stored among the first register information MR_1<3>, the second register information MR_2<3> and the third register information MR_3<3> based on the first output control signal POUT<1>.

The eighth pipe latch 632 may receive, through the node nd67, one register information generated among the first register information MR_1<3>, the second register information MR_2<3> and the third register information MR_3<3> based on the second input control signal PIN<2>, and store the received information. The eighth pipe latch 632 may output, to the node nd68, the information stored among the first register information MR_1<3>, the second register information MR_2<3> and the third register information MR_3<3> based on the second output control signal POUT<2>.

The ninth pipe latch 633 may receive, through the node nd67, one register information generated among the first register information MR_1<3>, the second register information MR_2<3> and the third register information MR_3<3> based on the third input control signal PIN<3>, and store the received information. The ninth pipe latch 633 may output, to the node nd68, the information stored among the first register information MR_1<3>, the second register information MR_2<3> and the third register information MR_3<3> based on the third output control signal POUT<3>.

The third initializing element 634 may include a PMOS transistor P63. The PMOS transistor P63 may be turned on in response to the reset signal RSTB and drive the node nd68 to the power supply voltage VDD. The reset signal RSTB may be generated at the logic low level for an initializing operation. The third initializing element 634 may initialize the node nd68 to a logic high level in the case where the reset signal RSTB is generated at the logic low level.

The third output buffer 635 may perform inversion operations and may include, for example, inverters IV65 and IV66. The inverter IV65 may invert and buffer the signal of the node nd68, and may output the third information signal OP<3> through a node nd69. The inverter IV66 may invert and buffer the signal of the node nd69, and may output a signal to the node nd68. The third output buffer 635 may output the third information signal OP<3> by inverting and buffering the signal of the node nd68, and may latch the signals of the node nd68 and the node nd69.

The operation of the semiconductor device 10 configured as mentioned above will be described below with reference to FIGS. 13 and 14.

Figure 13:
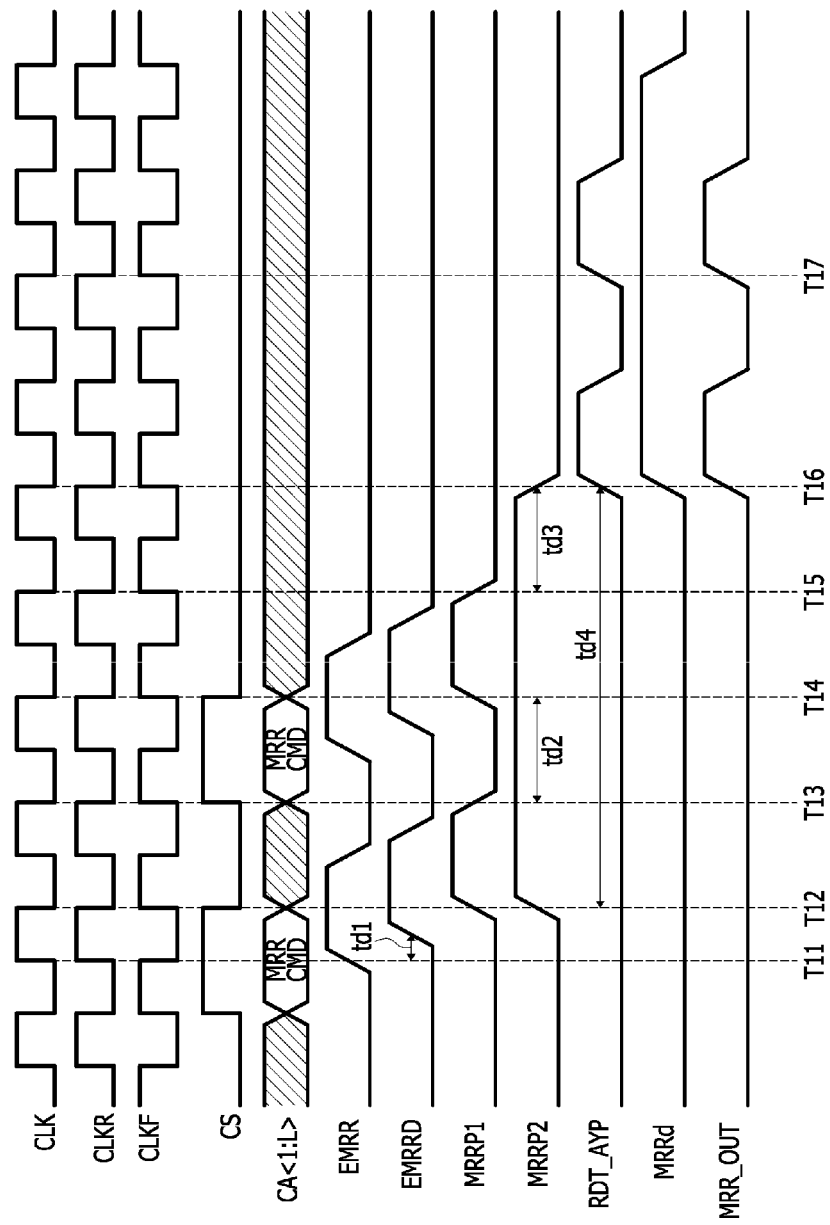
FIGS. 13 and 14 are representations of examples of timing diagrams to assist in the explanation of the operation of the semiconductor device illustrated in FIGS. 1 to 12.

As illustrated in FIG. 13, when a first mode register read command MRR CMD is inputted through the command address CA<1:L> in synchronization with the first internal clock CLKR in a state in which the chip select signal CS is a logic high level, the mode register read signal EMRR is generated at a time T11. At a time T12, as the mode register read signal EMRR is delayed by a first period td1, the delayed mode register read signal EMRRD is generated. At the time T12, the mode register read signal EMRR is latched in synchronization with the second internal clock CLKF and is outputted as the first mode register read pulse MRRP1. The second mode register read pulse MRRP2 has a pulse width that is extended by a second period td2 when compared to the pulse width of the first mode register read pulse MRRP1. When a second mode register read command MRR CMD is inputted through the command address CA<1:L> in synchronization with the first internal clock CLKR in a state in which the chip select signal CS is the logic high level, at a time T14, the mode register read signal EMRR is latched in synchronization with the second internal clock CLKF and is outputted as the first mode register read pulse MRRP1. The second mode register read pulse MRRP2 has a pulse width that is extended by a third period td3 when compared to the pulse width of the first mode register read pulse MRRP1. In an embodiment, while the second period td2 and the third period td3 are set to be the same with each other, it is to be noted that they may be set to be different from each other depending on an embodiment. The second mode register read pulse MRRP2 is generated as a level signal which has a logic high level from the time T12 to a time T16, by the mode register read commands MRR CMD which are successively inputted. The read column pulse RDT_AYP is generated by delaying the first mode register read pulse MRRP1 by a fourth period td4. The read column pulse RDT_AYP is generated as a logic high level pulse at each of the time T16 and a time T17. The delayed mode register signal MRRd is generated by delaying the second mode register read pulse MRRP2 by the fourth period td4. The output flag MRR_OUT is generated as the delayed mode register signal MRRd is latched in synchronization with the read column pulse RDT_AYP. The output flag MRR_OUT is generated as a logic high level pulse at each of the time T16 and the time T17.

Figure 14:
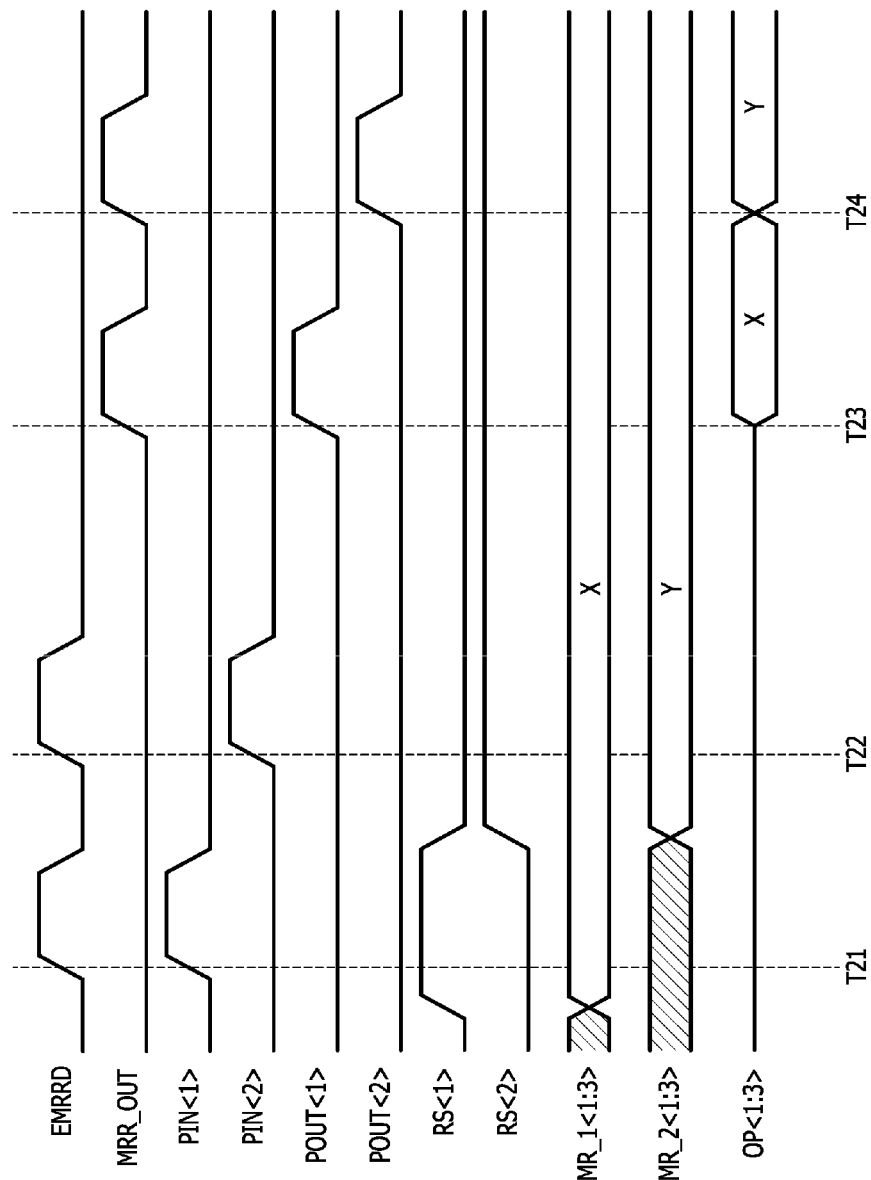

As illustrated in FIG. 14, each time the delayed mode register read signal EMRRD is generated, each of the first to third input control signals PIN<1:3> is sequentially generated. At a time T21, as the delayed mode register read signal EMRRD is generated first, the first input control signal PIN<1> is generated. At a time T22, as the delayed mode register read signal EMRRD is generated second, the second input control signal PIN<2> is generated. Each time the output flag MRR_OUT is generated, each of the first to third output control signals POUT<1:3> is sequentially generated. At a time T23, as the output flag MRR_OUT is generated first, the first output control signal POUT<1> is generated. At a time T24, as the output flag MRR_OUT is generated second, the second output control signal POUT<2> is generated. As the register select signal RS<1> transitions to the logic high level by the first mode register read command MRR CMD, the first register information MR_1<1:3> which has a logic level combination set to "X" is generated, and, as the register select signal RS<2> transitions to the logic high level by the second mode register read command MRR CMD, the second register information MR_2<1:3> which has a logic level combination set to "Y" is generated At the time T21, the first register information MR_1<1:3> which has the logic level combination set to "X" is stored in the information signal generation circuit 6 in synchronization with the first input control signal PIN<1> which is generated at a logic high level. At the time T22, the second register information MR_2<1:3> which has the logic level combination set to "Y" is stored in the information signal generation circuit 6 in synchronization with the second input control signal PIN<2> which is generated at a logic high level. At the time T23, the first register information MR_1<1:3> which has the logic level combination set to "X" and is stored in the information signal generation circuit 6 is outputted as the first to third information signals OP<1:3> in synchronization with the first output control signal POUT<1> which is generated at a logic high level. At the time T24, the second register information MR_2<1:3> which has the logic level combination set to "Y" and is stored in the information signal generation circuit 6 is outputted as the first to third information signals OP<1:3> in synchronization with the second output control signal POUT<2> which is generated at a logic high level.

In the semiconductor device 10 configured as mentioned above, one register information among the first register information MR_1<1:3>, the second register information MR_2<1:3> and the third register information MR_3<1:3> each of which is generated each time the mode register read command MRR CMD is generated is stored in the information signal generation circuit 6 and the stored information is outputted as the first to third information signals OP<1:3>, whereby it is possible to stably perform even successive mode register read operations. Since the information signal generation circuit 6 may be realized by simple circuits such as pipe latches, the semiconductor device 10 in accordance with the embodiments may realize successive mode register read operations through circuits which have a small current consumption and a small layout area.

Figure 15:
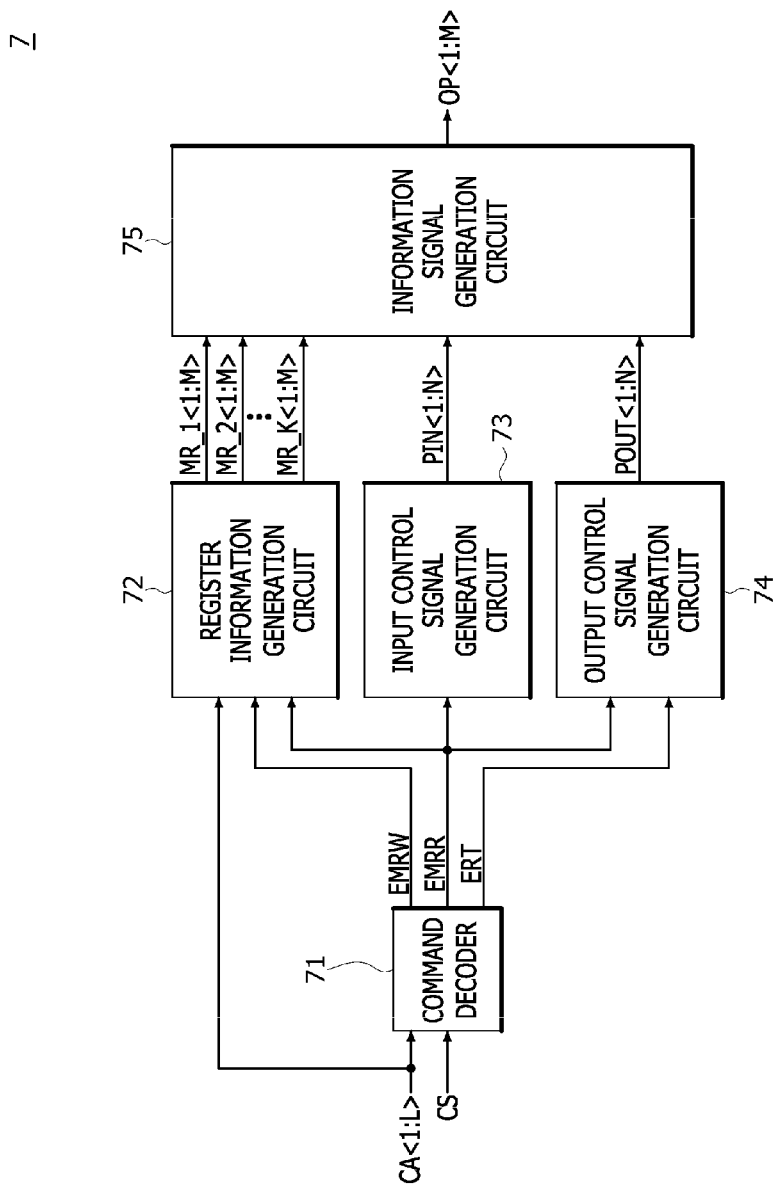
FIG. 15 is a block diagram illustrating a representation of an example of the configuration of a semiconductor device in accordance with other embodiments.

As illustrated in FIG. 15, a semiconductor device 7 in accordance with an embodiment may include a command decoder 71, a register information generation circuit 72, an input control signal generation circuit 73, an output control signal generation circuit 74 and an information signal generation circuit 75.

The command decoder 71 may generate a mode register write signal EMRW, a mode register read signal EMRR and a read signal ERT based on a command address CA<1:L> and a chip select signal CS. The command address CA<1:L> may include a command and an address which are applied from outside the semiconductor device 7. The bit number L of the command address CA<1:L> may be set variously depending on an embodiment.

The command decoder 71 may generate the mode register write signal EMRW in the case where the command address CA<1:L> having a first logic level combination is inputted in synchronization with the chip select signal CS. The mode register write signal EMRW may be generated for a mode register write operation of storing information in mode registers. The first logic level combination of the command address CA<1:L> for generating the mode register write signal EMRW may be set variously depending on an embodiment.

The command decoder 71 may generate the mode register read signal EMRR in the case where the command address CA<1:L> having a second logic level combination is inputted in synchronization with the chip select signal CS. The mode register read signal EMRR may be generated for a mode register read operation of outputting the information stored in mode registers. The second logic level combination of the command address CA<1:L> for generating the mode register read signal EMRR may be set variously depending on an embodiment.

The command decoder 71 may generate the read signal ERT in the case where the command address CA<1:L> having a third logic level combination is inputted in synchronization with the chip select signal CS. The read signal ERT may be generated for a read operation of outputting the data stored in memory cells. The third logic level combination of the command address CA<1:L> for generating the read signal ERT may be set variously depending on an embodiment.

The register information generation circuit 72 may generate first to K^th register informations MR_1<1:M>, MR_2<1:M>, . . . , MR_K<1:M> from the command address CA<1:L> based on the mode register write signal EMRW and the mode register read signal EMRR. The register information generation circuit 72 may selectively generate one information among the first to K^th register informations MR_1<1:M>, MR_2<1:M>, . . . , MR_K<1:M> depending on the logic level combination of the command address CA<1:L> in the case where the mode register write signal EMRW or the mode register read signal EMRR is generated.

The input control signal generation circuit 73 may generate first to N^th input control signals PIN<1:N> based on the mode register read signal EMRR. The input control signal generation circuit 73 may sequentially generate the first to N^th input control signals PIN<1:N> in the case where the mode register read signal EMRR is generated. The input control signal generation circuit 73 may generate the first input control signal PIN<1> in the case where the mode register read signal EMRR is generated first. The input control signal generation circuit 73 may generate the second input control signal PIN<2> in the case where the mode register read signal EMRR is generated second. The input control signal generation circuit 73 may generate the N^th input control signal PIN<N> in the case where the mode register read signal EMRR is generated N^th.

The output control signal generation circuit 74 may generate first to N^th output control signals POUT<1:N> based on the mode register read signal EMRR and the read signal ERT. The output control signal generation circuit 74 may generate the first to N^th output control signals POUT<1:N> at a time when a preset output delay period has elapsed in the case where the mode register read signal EMRR or the read signal ERT is generated. The output control signal generation circuit 74 may generate the first output control signal POUT<1> at a time when the output delay period has elapsed from a time when the mode register read signal EMRR or the read signal ERT is generated first. The output control signal generation circuit 74 may generate the second output control signal POUT<2> at a time when the output delay period has elapsed from a time when the mode register read signal EMRR or the read signal ERT is generated second. The output control signal generation circuit 74 may generate the N^th output control signal POUT<N> at a time when the output delay period has elapsed from a time when the mode register read signal EMRR or the read signal ERT is generated N^th.

The information signal generation circuit 75 may generate first to M^th information signals OP<1:M> from the first to K^th register informations MR_1<1:M>, MR_2<1:M>, . . . , MR_K<1:M> based on the first to N^th input control signals PIN<1:N> and the first to N^th output control signals POUT<1:N>. The information signal generation circuit 75 may store one register information generated among the first to K^th register informations MR_1<1:M>, MR_2<1:M>, . . . , MR_K<1:M> based on the first to N^th input control signals PIN<1:N>. The information signal generation circuit 75 may output the information stored among the first to K^th register informations MR_1<1:M>, MR_2<1:M>, . . . , MR_K<1:M>, as the first to M^th information signals OP<1:M>, based on the first to N^th output control signals POUT<1:N>.

Figure 16:
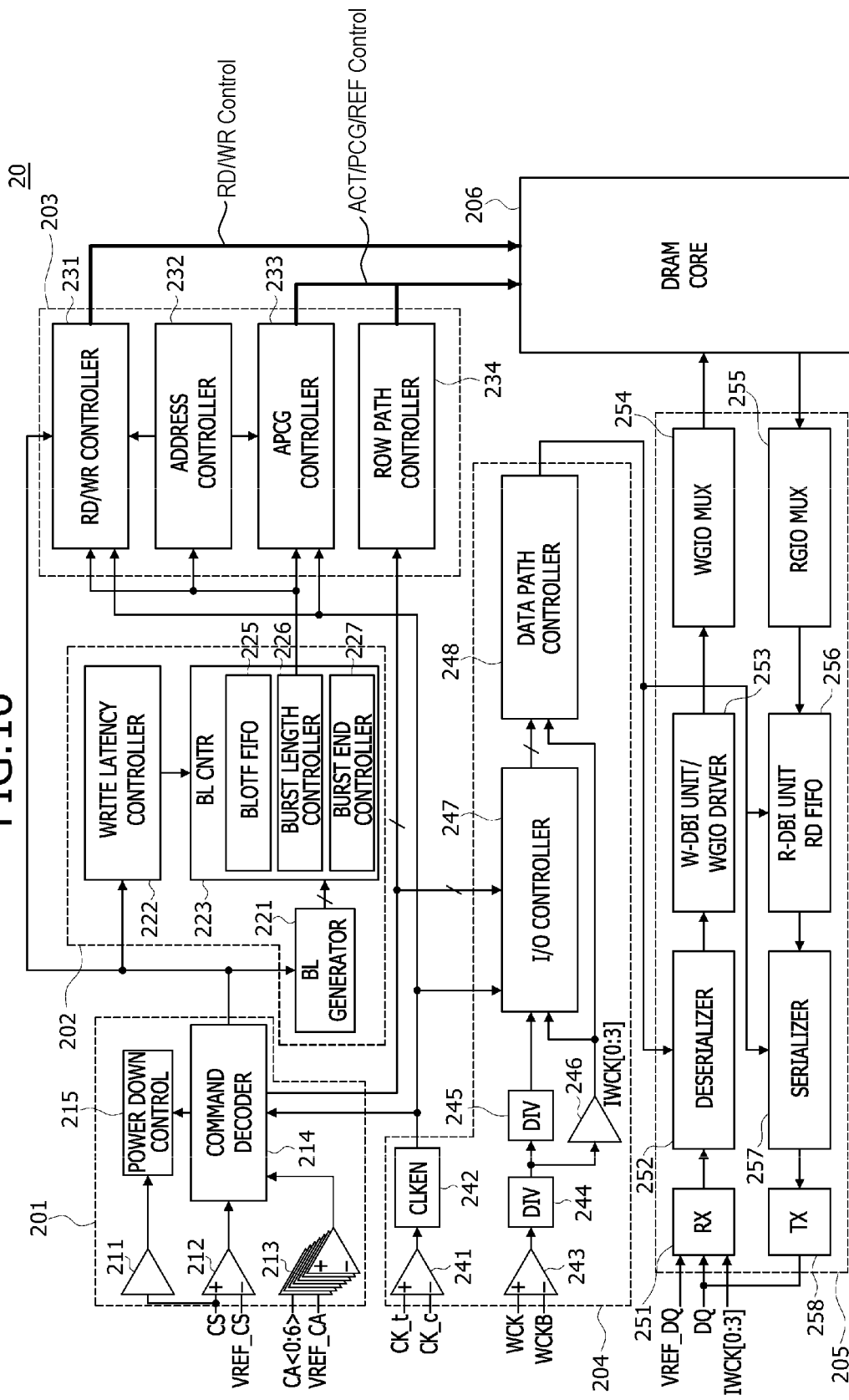
FIG. 16 is a block diagram illustrating a representation of an example of the configuration of a semiconductor device in accordance with other embodiments.

Referring to FIG. 16, a semiconductor device 20 in accordance with other embodiments may include a command control circuit 201, a latency burst control circuit 202, an operation control circuit 203, an input/output control circuit 204, a data input/output circuit 205 and a DRAM core 206.

The command control circuit 201 may include an input driving circuit 211, a chip select signal buffer 212, a command address buffer 213, a command decoder 214 and a power-down control circuit 215. The input driving circuit 211 may receive and drive a chip select signal CS and transfer it to the power-down control circuit 215. The chip select signal buffer 212 may buffer and receive the chip select signal CS based on a chip select reference voltage VREF_CS. The command address buffer 213 may buffer and receive a command address CA<0:6> based on a command address reference voltage VREF_CA. The command decoder 214 may decode the command address CA<0:6> buffered through the command address buffer 213, based on the chip select signal CS buffered through the chip select signal buffer 212, and may generate various commands necessary for the operation of the semiconductor device 20. The power-down control circuit 215 may control a power-down mode based on the chip select signal CS which is transferred by being driven through the input driving circuit 211 and a command which is generated in the command decoder 214.

The latency burst control circuit 202 may include a burst length information generator 221, a write latency controller 222 and a burst length control circuit 223. The burst length information generator 221 may generate informations necessary for controlling a burst length operation, based on a command transferred through the command decoder 214. The write latency controller 222 may perform a control operation depending on a write latency, based on a command transferred through the command decoder 214. The burst length control circuit 223 may include an information storage circuit 225 which stores information transferred from the burst length information generator 221. The burst length control circuit 223 may include a burst length controller 226 for controlling the bust length operation based on a command transferred through the command decoder 214, a signal transferred from the write latency controller 222 and information transferred from the burst length information generator 221. The burst length control circuit 223 may include a burst end controller 227 for controlling a bust end operation based on a command transferred through the command decoder 214, a signal transferred from the write latency controller 222 and information transferred from the burst length information generator 221.

The operation control circuit 203 may include a read/write controller 231, an address controller 232, an auto-precharge controller 233 and a row path controller 234, and may generate a read/write control signal RD/WR Control for controlling a read operation and a write operation and a row path control signal ACT/PCG/REF Control for controlling an active operation, a precharge operation and a refresh operation. The read/write controller 231 may control the read operation and the write operation based on a signal transferred from the latency burst control circuit 202 and a signal transferred from the address controller 232 when clocks CK_t and CK_c are activated. The address controller 232 may control address generation based on a signal transferred from the latency burst control circuit 202. The auto-precharge controller 233 may control an auto-precharge operation based on a signal transferred from the latency burst control circuit 202 when the clocks CK_t and CK_c are activated. The row path controller 234 may control a row path based on a command transferred through the command decoder 214.

The input/output control circuit 204 may include a first clock buffer 241, a clock enable signal generator 242, a second clock buffer 243, a first divider 244, a second divider 245, an internal clock driver 246, an input/output controller 247 and a data path controller 248. The first clock buffer 241 may buffer and receive the clocks CK_t and CK_c. The clock enable signal generator 242 may generate a clock enable signal after the clocks CK_t and CK_c buffered and received through the first clock buffer 241 are activated. The second clock buffer 243 may buffer and receive data clocks WCK and WCKB for data input/output. The first divider 244 may divide the data clocks WCK and WCKB which are buffered and received through the second clock buffer 243. The second divider 245 may receive and divide a clock divided through the first divider 244. The internal clock driver 246 may receive and divide the clock divided through the first divider 244, and may generate an internal data clock IWCK[0:3]. The input/output controller 247 may control data input/output by receiving a clock divided through the second divider 245 and the internal data clock IWCK[0:3]. The data path controller 248 may control a data path to be used in data input/output, based on a signal transferred through the input/output controller 247 and the internal data clock IWCK[0:3].

The data input/output circuit 205 may include a receiver 251, a deserializer 252, a write driver 253, a write multiplexer 254, a read multiplexer 255, a read driver 256, a serializer 257 and a transmitter 258. The receiver 251 may receive transmission data DQ based on a data reference voltage VREF_DQ in synchronization with the internal data clock IWCK[0:3]. The deserializer 252 may convert the transmission data DQ received in series through the receiver 251, into parallel data. The write driver 253 may drive the parallel-converted data and transfer it to the write multiplexer 254. The write multiplexer 254 may load the data driven through the write driver 253, on an input/output line through multiplexing, and may transfer the loaded data to the DRAM core 206. The read multiplexer 255 may multiplex and output data outputted through an input/output line from the DRAM core 206 in the read operation. The read driver 256 may drive and output data transferred through the read multiplexer 255, to the serializer 257. The serializer 257 may convert the data driven through the read driver 256 and received in parallel, into serial data. The transmitter 258 may transmit the data serial-converted by the serializer 257, as transmission data DQ.

The DRAM core 206 may perform the read operation and the write operation of inputting and outputting data through the data input/output circuit 205, based on the read/write control signal RD/WR Control. The DRAM core 206 may perform the active operation, the precharge operation and the refresh operation based on the row path control signal ACT/PCG/REF Control.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    an input control signal generation circuit configured to sequentially generate a first input control signal and a second input control signal based on a mode register read signal;
    an output control signal generation circuit configured to sequentially generate a first output control signal and a second output control signal based on the mode register read signal; and
    an information signal generation circuit configured to store register information depending on the first input control signal when the mode register read signal is generated first, output the stored register information as an information signal depending on the first output control signal, store the register information depending on the second input control signal when the mode register read signal is generated second, and output the stored register information as the information signal depending on the second output control signal.

2. The semiconductor device according to claim 1, wherein the mode register read signal is generated by decoding a command address to perform a mode register read operation.

3. The semiconductor device according to claim 1, wherein the first output control signal and the second output control signal are generated after the first input control signal and the second input control signal are generated.

4. The semiconductor device according to claim 1, wherein the information signal generation circuit comprises:
    a first pipe latch configured to store the register information depending on the first input control signal, and output the stored register information depending on the first output control signal; and
    a second pipe latch configured to store the register information depending on the second input control signal, and output the stored register information depending on the second output control signal.

5. The semiconductor device according to claim 1, further comprising:
    a register information generation circuit configured to generate the register information based on the mode register read signal.

6. The semiconductor device according to claim 5, wherein the register information generation circuit comprises a plurality of registers, and outputs information stored in registers selected among the plurality of registers, as the register information, when the mode register read signal is generated.

7. The semiconductor device according to claim 5, wherein the register information generation circuit comprises:

a select control signal generation circuit configured to generate a select control signal from the command address, based on the mode register read signal; and a register information storage circuit configured to select some registers among the plurality of registers by a register select signal generated by decoding the select control signal, and output information stored in the selected registers, as the register information.

8. The semiconductor device according to claim 7, wherein the register select signal comprises a first register select signal and a second register select signal, the register information comprises a first register information and a second register information, the register information storage circuit comprises a first register information storage circuit and a second register information storage circuit, the first register information storage circuit comprises a first register, the second register information storage circuit comprises a second register, the first register information storage circuit outputs information stored in the first register, as the first register information, when the first register select signal is generated, and the second register information storage circuit outputs information stored in the second register, as the second register information, when the second register select signal is generated.

9. A semiconductor device comprising:
an output control signal generation circuit configured to sequentially generate output control signals based on a mode register read signal including a mode register read command; and
an information signal generation circuit configured to output stored register information depending on the output control signals.

10. The semiconductor device according to claim 9, wherein the output control signal generation circuit generates the output control signals at a time when a preset output delay period has elapsed in synchronization with a second internal clock signal, when the mode register read command or read signal is generated.

11. The semiconductor device according to claim 10, wherein the information signal generation circuit includes a first pipe latch configured to store register information and a second pipe latch configured to store other register information different from the register information stored in the first pipe latch, wherein the output control signal generation circuit generates a first output control signal from the control signals at a time when the preset output delay period has elapsed from a time when the mode register read signal or the read signal is generated a first time and generates a second output control signal from the control signals at a time when the preset output delay period has elapsed from a time when the mode register read signal or the read signal is generated a second time, and wherein the first pipe latch outputs the register information stored within when the first output control signal is generated and the second pipe latch outputs the other register information stored within when the second output control signal is generated.

12. The semiconductor device according to claim 10, further comprising:
a command decoder configured to generate the read signal depending on the logic level of a command address received in synchronization with a chip select signal and a first internal clock signal, and to generate the mode register read signal depending on the logic level of the command address received in synchronization with the chip select signal and the first internal clock signal.

* * * * *